United States Patent [19]
Crozier et al.

[11] Patent Number: 5,642,048
[45] Date of Patent: Jun. 24, 1997

[54] RF RESONATOR FOR NMR

[75] Inventors: Stuart Crozier, Wilston; David Michael Doddrell, Westlake, both of Australia

[73] Assignee: The University of Queensland, St. Lucia, Australia

[21] Appl. No.: 602,551

[22] Filed: Feb. 20, 1996

[30] Foreign Application Priority Data

Feb. 21, 1995 [AU] Australia ................................. PN1245

[51] Int. Cl.$^6$ .................................................. G01V 3/00
[52] U.S. Cl. ...................................... 324/318; 128/653.5
[58] Field of Search ........................... 324/318, 322, 324/300, 307, 309; 128/653.5

[56] References Cited

U.S. PATENT DOCUMENTS

| | | |
|---|---|---|
| 4,638,253 | 1/1987 | Jaskolski et al. |
| 4,694,255 | 9/1987 | Hayes . |
| 4,825,163 | 4/1989 | Yabusaki et al. ............... 324/318 |
| 4,837,515 | 6/1989 | Nishihara et al. . |
| 4,875,013 | 10/1989 | Murakami et al. ............... 324/318 |
| 4,887,039 | 12/1989 | Roemer et al. ............... 324/318 |
| 5,109,198 | 4/1992 | Murakami et al. . |

FOREIGN PATENT DOCUMENTS 0177855  4/1986  European Pat. Off. ........ G01R 33/34

OTHER PUBLICATIONS

"An Efficient, Highly Homogeneous Radiofrequency Coil for Whole-Body NMR Imaging at 1.5 T" by Hayes et al. in: Journal of Magnetic Resonance 63, pp. 622–628 (1985).

*Primary Examiner*—Louis M. Arana
*Attorney, Agent, or Firm*—Paul J. Vincent

[57] ABSTRACT

The invention concerns a birdcage resonator used as a transmitter and/or receiver coil in an NMR apparatus. The resonator comprises two ring-shaped conductors each of which is interrupted along its outer periphery by capacitors, the ring-shaped conductors being connected together by axial conducting strips. A plurality of axial conducting strips have their ends located between each pair of peripherally neighbouring capacitors. It is preferred when RF energy is coupled in or out between two conducting strips and when the ring-shaped conductors are shielded by shielding rings in the direction towards the sample. The birdcage resonator in accordance with the invention exhibits an improved RF field homogeneity at higher Q compared to conventional birdcage resonators.

18 Claims, 6 Drawing Sheets

RF RESONATOR FOR NMR

BACKGROUND OF THE INVENTION

This invention relates to an RF excitation and/or receiver for use in an NMR apparatus, the probe comprising a generally tubular member acting as an RF resonator and having a plurality of circumferentially spaced axial conductors extending between a pair of spaced ring-like conductors, and a plurality of capacitive elements spaced along and interrupting the ring-like conductors. In particular the invention concerns a device for irradiating a sample with radio frequency (RF) energy and receiving NMR signals from it. The device may be used as either a transmitter or receiver, or both.

A device of this kind is, for example, known in the art from EP 0 177 855 B1.

The principal governing relationship in NMR is the Larmor equation:

$$\omega = \gamma B_0$$

where $\omega$ is the Larmor precessional frequency, $\gamma$ is the nuclei specific gyromagnetic ratio and $B_0$ is the applied magnetic field. This equation applies to the situation where an ensemble of nuclei possessing nuclear spin are subjected to a strong magnetic field. A number of possible energy levels are developed by the interaction of the nuclear spins (which possess magnetic moments) and the applied field. In order to induce transitions between these energy levels, RF energy ($B_1$ field) is applied to the ensemble at the Larmor precessional frequency, with a $B_1$ direction orthogonal to the direction of the applied field.

After the RF excitation is removed or ceases, the spin ensemble tends to return to its original state and in doing so emits energy. This is the received NMR signal. This signal can be detected by the same device (termed an RF probe) that was used to transmit the RF excitation, or by a separate probe. The (or each) probe normally comprises a coil or coil-like structure. In either case the probe(s) is/are tuned to, or near to the Larmor frequency.

It is most important in NMR and magnetic resonance imaging (MRI) experiments to maximize the signal-to-noise ratio (SNR) of the experiment, and to irradiate all parts of the sample with the same strength RF field. Similarly, it is important that the NMR signal from all parts in the sample be received by the RF probe with the correct weighting. Perhaps the two most important characteristics of an RF probe are the provision of a homogeneous $B_1$ field in the volume of the probe coil, and the possession of a high quality factor (Q). By reciprocity, if a coil provides homogeneous excitation it will also receive NMR signals in a homogeneous fashion. In this specification it will be assumed that discussions of excitation distributions of coils apply with equal relevance to their use as NMR receivers.

The Q of a coil is defined as $2\pi$ times the ratio of the time-averaged stored energy in the cavity to the energy loss per cycle. The Q of a coil has a profound effect on the SNR of the NMR experience (SNR $\alpha$ $(Q)^{1/2}$).

Prior art probes have been designed to provide a homogeneous $B_1$ field without regard to Q, or a high Q coil without regard to RF field homogeneity, since optimization of one is usually at the expense of degradation of the other.

It is an object of this invention to provide an RF coil that provides both a substantially homogeneous RF field and a high quality factor.

It is a preferred object of this invention to provide an RF coil which optimizes both the homogeneity of the RF field and the Q of the probe for a particular situation.

SUMMARY OF THE INVENTION

In accordance with the invention the number of capacitive elements on each of the ring-like conductors is smaller than the number of axial conductors.

In a broad form, the invention provides an improved RF excitation and/or receiver probe for use in an NMR apparatus, the probe comprising a generally tubular member having a plurality of circumferentially spaced axial conductors extending between a pair of spaced ring-like conductors, and a plurality of capacitative elements spaced along the ring-like conductors.

The tubular member serves as the RF coil or "resonator".

In a first aspect of the invention, the number of capacitative elements in the coil is limited to avoid significant fall-off in the quality factor of the coil. The maximum number of capacitors to be used is determined from the size of the coil and its frequency of operation.

In another aspect of the invention, the coil is characterized in that it has a plurality of axial conductors between each adjacent pair of capacitors. It has been found that using a parallel array of rungs between each adjacent pair of capacitors, and varying the width of the rungs, results in better approximation of the desired current density.

In yet another aspect of the invention, RF energy is fed to the probe between axial conductors thereof. This inter-rung feeding arrangement improves the RF field homogeneity within the coil.

Preferably, guard rings are placed inside the ring-like conductors of the coil to limit the RF window of the coil and minimize degradation of the quality factor of the coil by reducing the losses resulting from electric field linking to the sample within the coil.

The RF probe can advantageously comprise a plurality of axial conductors between each pair of adjacent capacitive elements on the ring-like conductors.

The RF probe can advantageously have exactly two axial conductors between each pair of adjacent capacitive elements on the ring-like conductors.

The RF probe can advantageously comprise 16 axial conductors.

The RF probe can advantageously have less than 9 capacitive elements on each of the ring-like conductors.

The RF probe can advantageously have an operating frequency equal to or greater than 200 MHz, in particular 300 MHz.

The RF probe can advantageously have axial conductors which are conducting strips of finite widths.

The RF probe can advantageously have an inner diameter of the tubular member of less than 100 mm, in particular 64 mm.

The RF probe can advantageously have axial conductors of different widths.

The RF probe can advantageously have axial conductors distributed azimuthally in such a way that a sinusoidal current distribution is optimally approximated.

The RF probe can advantageously have the RF energy fed to the probe or extracted from the probe between axial conductors thereof.

The RF probe can advantageously have conductive guard rings placed internal to the capacitors to limit the RF window of the probe and to lower dielectric losses to a sample inside the tubular member.

In order that the invention may be more fully understood and put into practice, a preferred embodiment thereof will now be described with reference to the accompanying drawings.

BRIEF DESCRIPTION OF THE DRAWING

In the drawings,

FIG. 4a illustrates the transverse RF field distribution for the coil of FIG. 3a;

An RF coil or resonator typically consists of a number of inductive structures distributed around a tube of circular cross-section. In order to generate a homogeneous transverse RF field, it is necessary to establish a current distribution of longitudinal current (the longitudinal direction being defined by the axis of the resonator) such that the current varies as sin θ, where θ is the azimuthal angle. This is discussed in prior art U.S. Pat. No. 4,694,255 and EP 0 177 855 B1 the disclosure of which are herein incorporated by reference.

Typically, this current distribution is established by creating a standing wave around the periphery of the coil by separating each rung by an appropriate capacitor, and thereby also creating a tuned structure, or by having capacitors in each longitudinal element which would then be connected at the top. Such arrangements are commonly known as "birdcage" resonators (details of which are given in Journal of Magnetic Resonance, 63,622 (1985)).

As the number of capacitors and inductive elements is increased around the structure, the desired sin θ current distribution is better approximated. The conventional design process is to include as many of these structures into the coil as possible and still tune the coil to the desired frequency. However, a large number of capacitors in the structure results in large energy losses due to both reactive and non-reactive losses in the capacitors. This is partly due to the capacitors experiencing a very large electric field resulting in significant dielectric losses. Thus, although increasing the number of capacitors improves homogeneity, the quality factor decreases significantly.

In this invention, unlike conventional design, the number of capacitors is limited to maintain quality factor yet still achieve a sufficient degree of homogeneity. To illustrate the effect on specific coil designs, we will detail designs of a coil with an internal diameter of 64 mm, although the designs discussed here may be equally applied to coils of any dimension.

Figure 1:
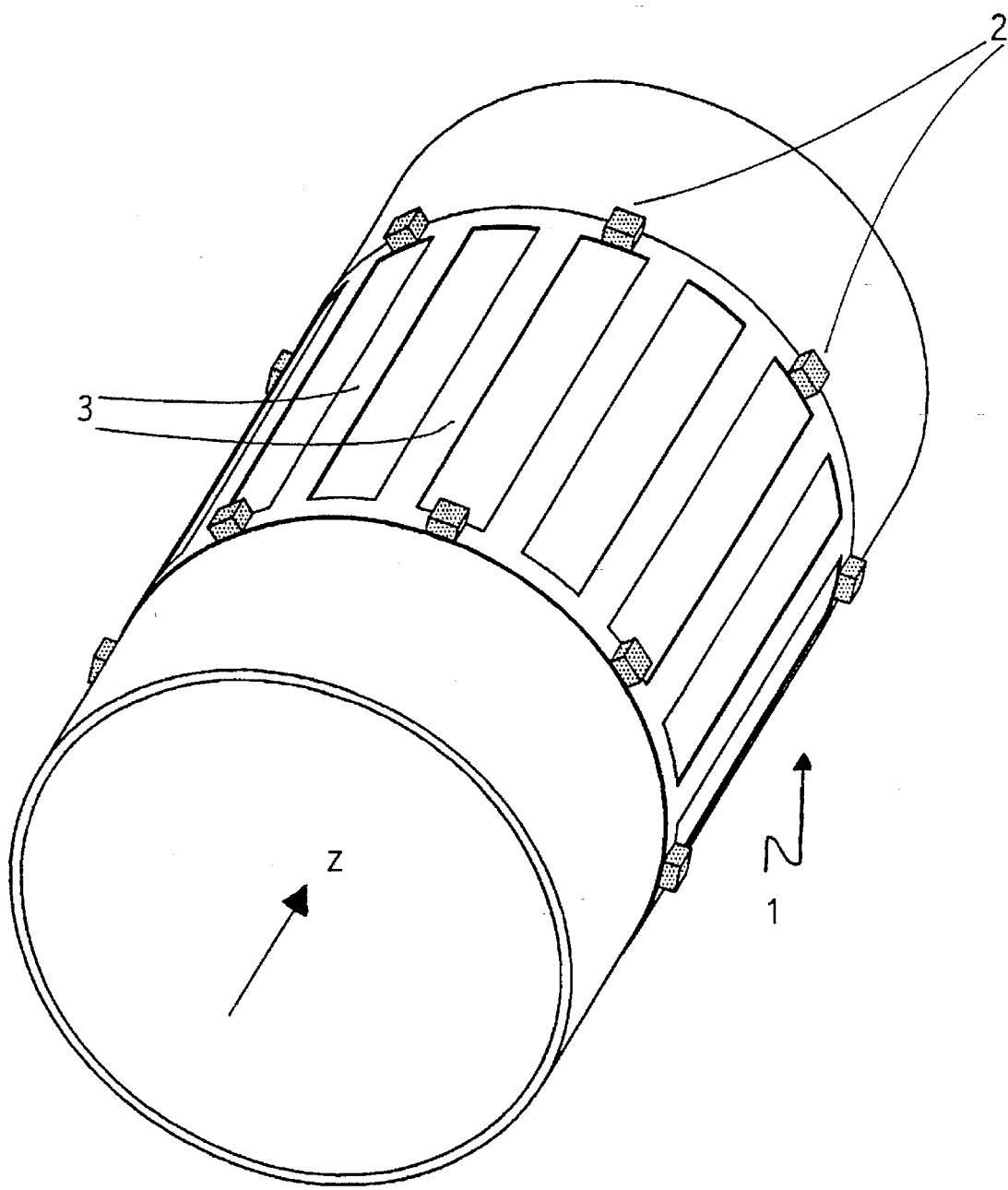
FIG. 1 is a perspective view of a coil resonator according to one embodiment of the invention.

FIG. 1 illustrates a preferred embodiment of a resonant structure suitable for use in an NMR probe head. The number of capacitors is restricted at a particular operating frequency in order to reduce losses in the resonator structure, and in between each capacitor is an array of conductors, distributed so as to best mimic the desired current density.

The maximum number of capacitors to be used depends on the size of the coil and its frequency of operation. For coils with an internal diameter of 64 mm, a significant fall-off in Q occurs when the number of capacitors exceeds eight. The quality and indeed the quality factor of a capacitor is a frequency dependent value; manufacturers generally provide performance specification curves that correlate capacitor value and frequency of operation with the Q and Effective Series Resistance (ESR) of the Capacitors. The ESR is a value that includes all losses in the capacitor. To minimize this value, high performance capacitors are used and the number of capacitors (and concomitant losses) is reduced.

The rung distribution is optimized by introducing a parallel array of rungs between each pair of capacitors and varying the width of the rungs. The distribution of the conductors is such that they more closely generate the desired current density.

As shown in FIG. 1, the coil 1 comprises inductive rungs 3 running parallel to the Z axis between adjacent pairs of capacitors 2. Although only two rungs 3 connected in parallel are shown here for clarity, many could be used. When a large number of inter-capacitor rungs are used, their azimuthal spacing is chosen such that they best approximate that segment of the standing wave quantized by the capacitor.

Figure 2A:
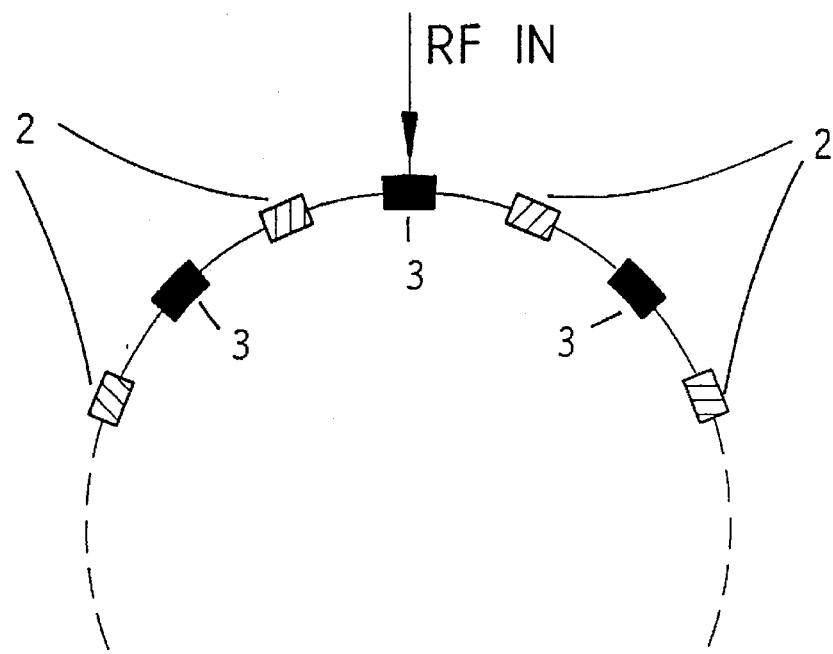
FIG. 2a illustrates feeding of a resonator coil according to prior art.
Figure 2B:
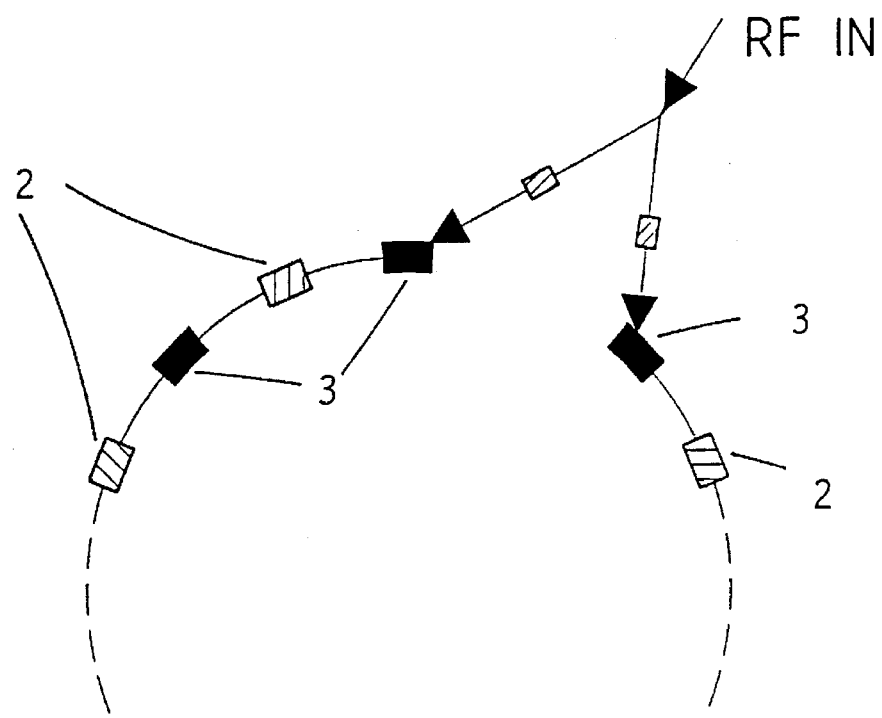
FIG. 2b illustrates inter-rung feeding of a resonator coil according to the invention.

Further to the novel rung arrangement, an inter-rung feeding scheme is used to provide additional improvement to the RF field homogeneity. The scheme is shown schematically in FIG. 2b, in contrast to the conventional method of rung feedings shown schematically in FIG. 2a. These figures are cross-sections (in the Y plane) of FIG. 1. This is a capacitive coupling feeding arrangement and prior to the feed point shown (labelled RF in) are the normal variable tuning and matching capacitors being fed from an RF amplifier.

Figure 3A:
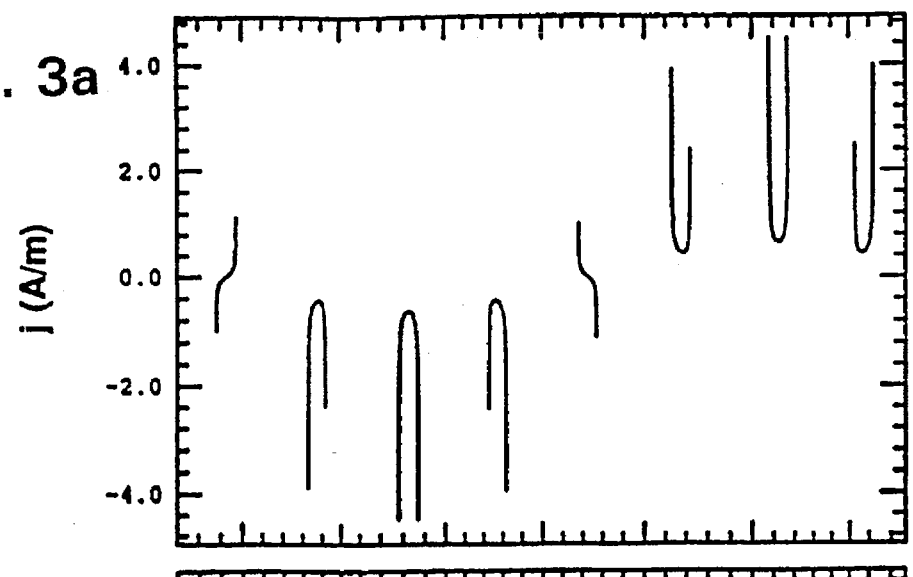
FIG. 3a illustrates the current density distribution from a standard rung fed design.
Figure 3B:
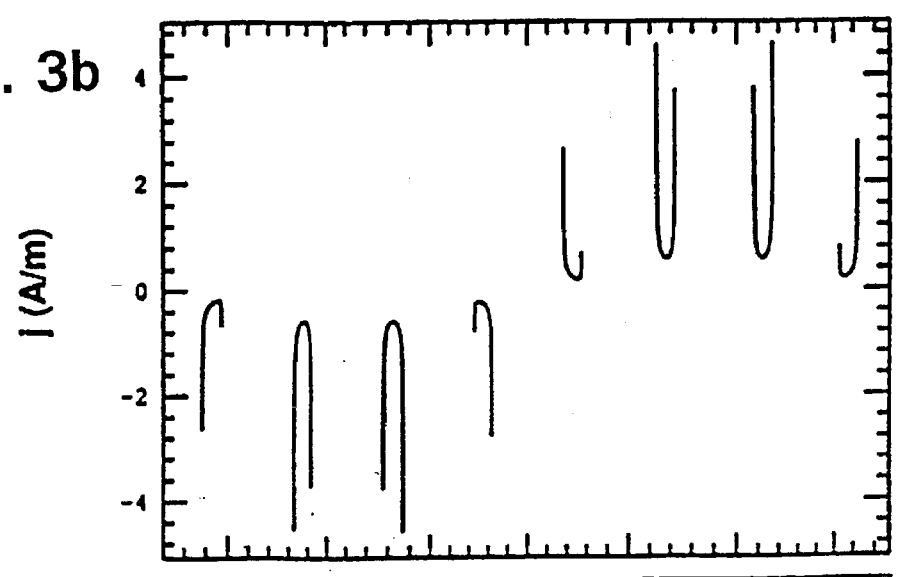
FIG. 3b illustrates the current density distribution from an inter-rung fed device with no rings carrying zero integrated current.
Figure 3C:
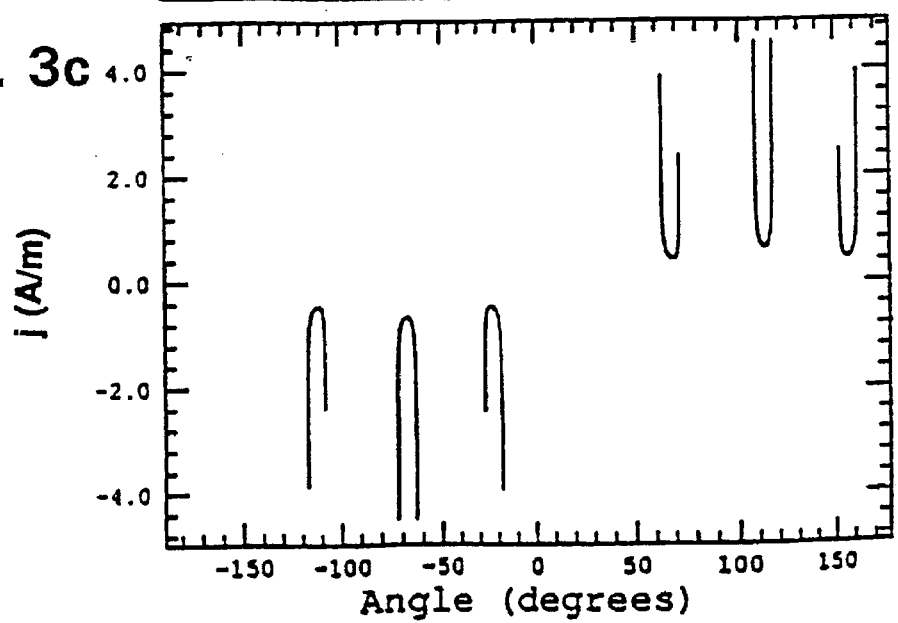
FIG. 3c illustrates the current density distribution showing the effect of removing rungs completely from the structure.

To illustrate the effect of inter-rung feeding, the resultant current densities from a conventional eight rung resonator and that from an inter-rung fed design are shown in FIGS. 3a, 3b, and 3c. In these examples, the rung width was 5 mm and the frequency of operation was 300 MHz.

It will be assumed for simplicity in the present analysis that field and current variations are purely sinusoidal in the z-direction so that the Transverse Electric and Magnetic (TEM) approximation can be invoked. It follows that the electric field E, the magnetic induction field B and the current density j per unit cross-sectional width of the conducting strip can be expressed in the (approximate) forms $$E(x,y,z,t) = E_T(x,y)\exp(i\omega[\sqrt{\mu\epsilon}z - t]) \quad (1)$$

$$B(x,y,z,t) = B_T(x,y)\exp(i\omega[\sqrt{\mu\epsilon}z - t])$$

$$j(x,y,z,t) = j_T(x,y)\exp(i\omega[\sqrt{\mu\epsilon}z - t]),$$

where the magnetic permeability and electric permittivity of the air surrounding the conducting strips are μ and ϵ, respectively, the angular frequency of the signal is ω, and t denotes time. In this TEM approximation, the transverse parts $E_T$ and $B_T$ of the electric and magnetic fields have no axial component, so that $E_T \cdot k = 0$ and $B_T \cdot k = 0$, and k denotes the unit vector pointing in the z-direction.

A consequence of the assumption (1) of TEM-mode solutions is that the full system of governing equations (Maxwell's equations) possesses solutions in which there is a simple relationship between the magnetic and electric fields, given by $$B_T = -\sqrt{\mu\epsilon} \ (k \times E_T). \quad (2)$$

Furthermore, it follows from equations (1) and (2) that Faraday's law reduces to $$\nabla_2 \times E_T = 0,$$

from which a scalar potential $\Phi$ can be defined immediately for the electric field, according to the relation $E_T = -\nabla_2 \Phi$. Here, $\nabla_2 = (\partial/\partial x, \partial/\partial y)$ is the gradient operator in the transverse plane.

For the purposes of computing the electric and magnetic fields within the probe and the current densities within the longitudinal rungs, it will be assumed that the copper rungs in the resonator are perfect conductors. The boundary condition to be imposed is therefore that $\Phi$ must be constant along the surface of each conductor.

Once the scalar potential $\Phi$ has been determined, the transverse part $j_T$ of the current density at the surface of the conductor may be determined according to $$j_T = \sqrt{\mu/\epsilon} \ (n \cdot \nabla_2 \Phi) k, \quad (3)$$

where n represents the normal to the conducting surface.

Since the interior of the MRI probe does not possess sources of charge, Maxwell's equations also reveal that the transverse part of the electric field is solenoidal, so that $\nabla_2 \cdot E_T = 0$, under the TEM approximation (1) and the relationship (2). It follows that the scalar potential $\Phi$ satisfies Laplace's equation $\nabla_2^2 \Phi = 0$.

A numerical algorithm based on the Inverse Finite Hilbert Transform was used to obtain the final current density after applying the appropriate boundary conditions. FIG. 3a shows the current density resulting from a standard rung fed design. In such a design, two of the rungs carry zero integrated current. FIG. 3c shows the effect of removing such rungs from the structure entirely (which is done for mode-stabilization). FIG. 3b shows the resultant current density from an inter-rung fed device in which no rungs carry zero integrated current.

Figure 4A:
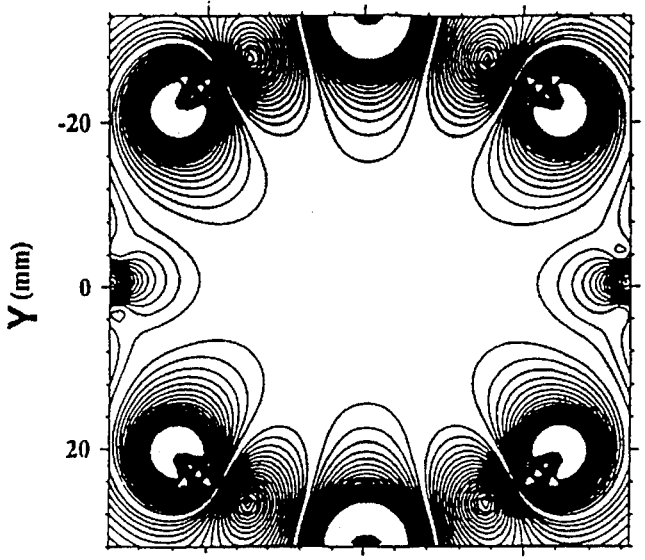
Figure 4B:
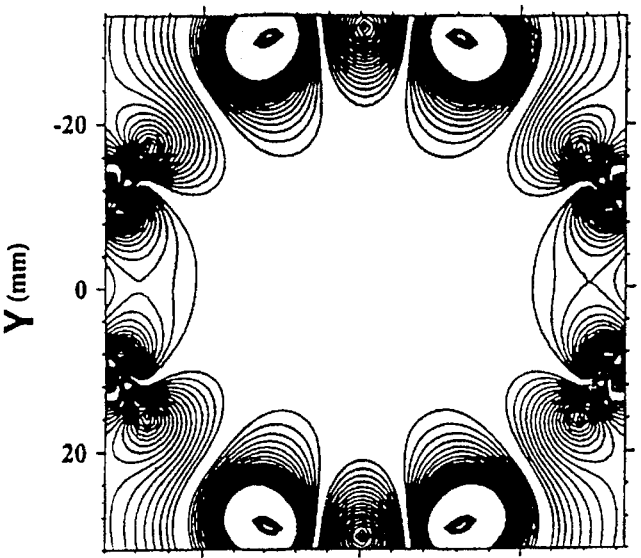
FIG. 4b illustrates the transverse RF field distribution for the coil of FIG. 3b.
Figure 4C:
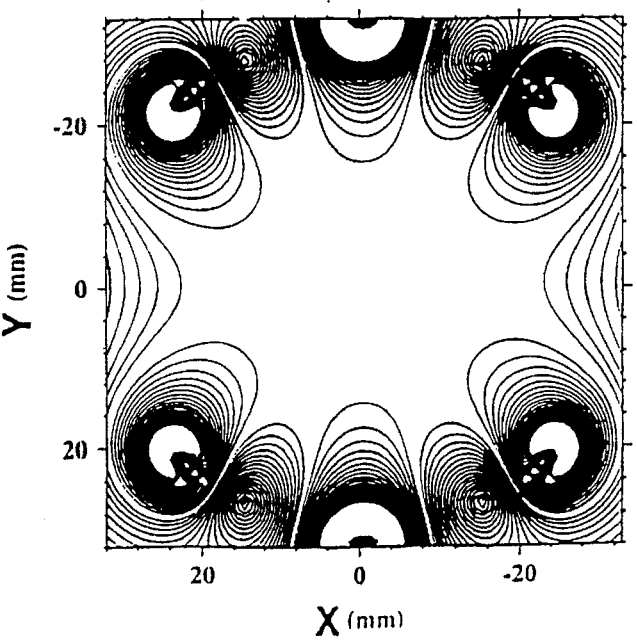
FIG. 4c illustrates the transverse RF field distribution for the coil of FIG. 3c.

The transverse RF fields:

$$B_T = \sqrt{B_x^2 + B_y^2}$$

were then calculated from the current densities for each coil arrangement. The transverse fields corresponding to the current densities of FIGS. 3a, 3b, and 3c are shown in FIGS. 4a, 4b, and 4c. The fields are shown as contour plots of the deviation from a perfectly homogeneous field, with each contour representing a 5% level away from the normalized central region. The area contained by the first contour then represents a field with a deviation from homogeneity of less than 5%; similarly the area contained by the second contour from the centre represents 10% or better homogeneity, etc. The fields were calculated in 1 mm intervals across the structure at 300 MHz.

The drawings show significantly improved homogeneity in the central region of the coil that used inter-rung feeding (FIG. 4b).

Figure 5A:
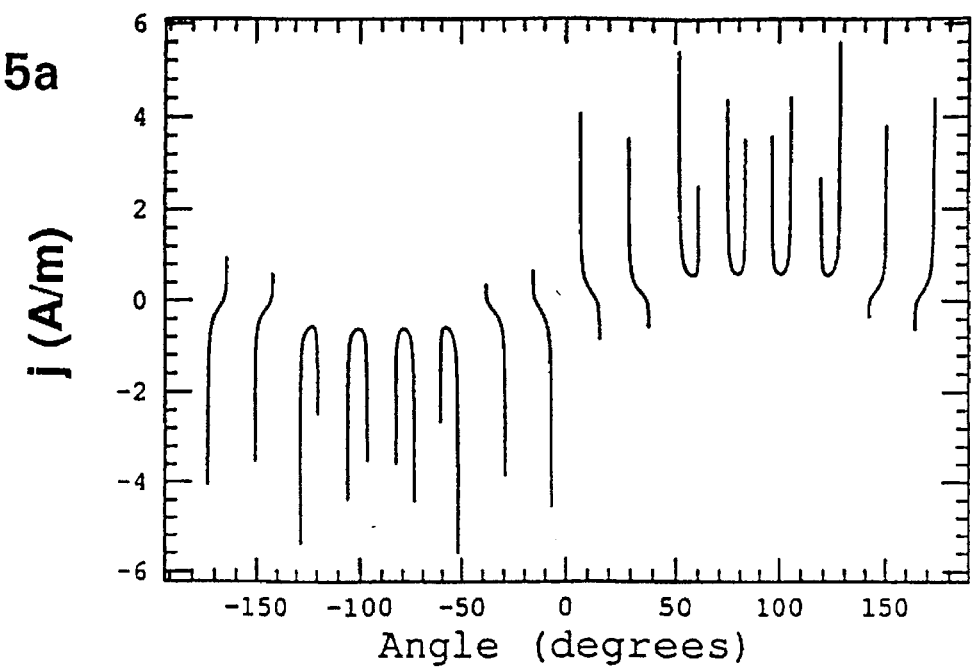
FIG. 5a shows the current density distribution for the inter-rung hybrid coil design of FIG. 1.
Figure 5B:
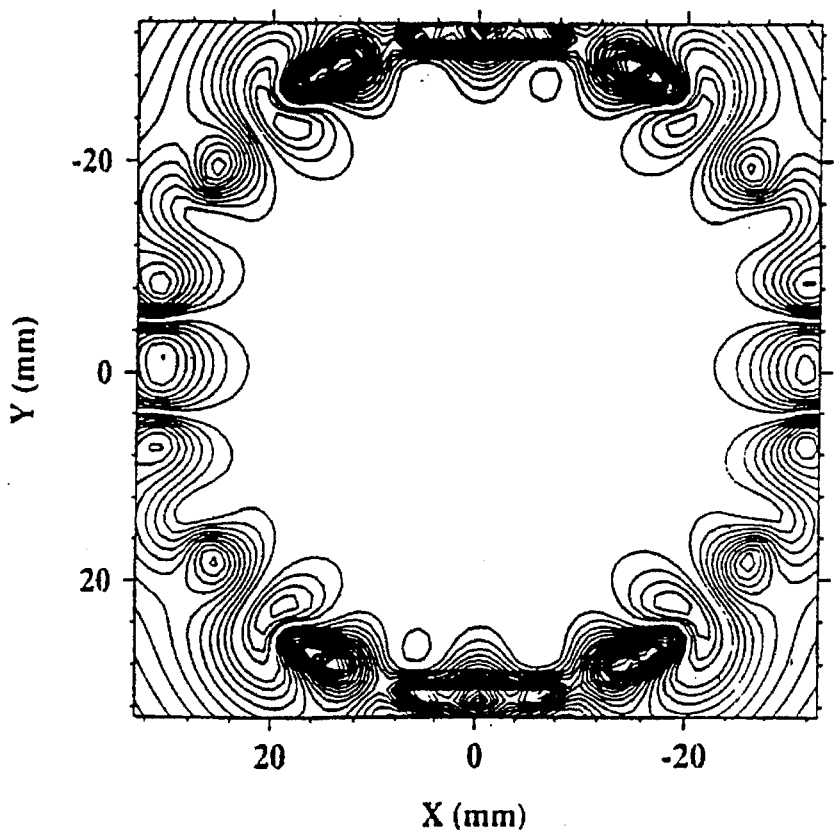
FIG. 5b shows a transverse field deviation for the inter-rung hybrid coil design of FIG. 1.

FIGS. 5a and 5b depict the current density and field plots, shown as 5% contours, for an inter-rung hybrid coil design having a parallel array of rungs between each adjacent set of capacitors as shown in FIG. 1. These results demonstrate the further improvement in field homogeneity while maintaining Q. A coil of these dimensions was built and its Q was measured to be 190. Measurements were made on a HP8711A network analyzer at 3 dB points. An equivalent conventional coil of 16 rungs and 16 capacitors has a measured Q of 85. The described design provides improved performance over conventional designs.

Figure 6:
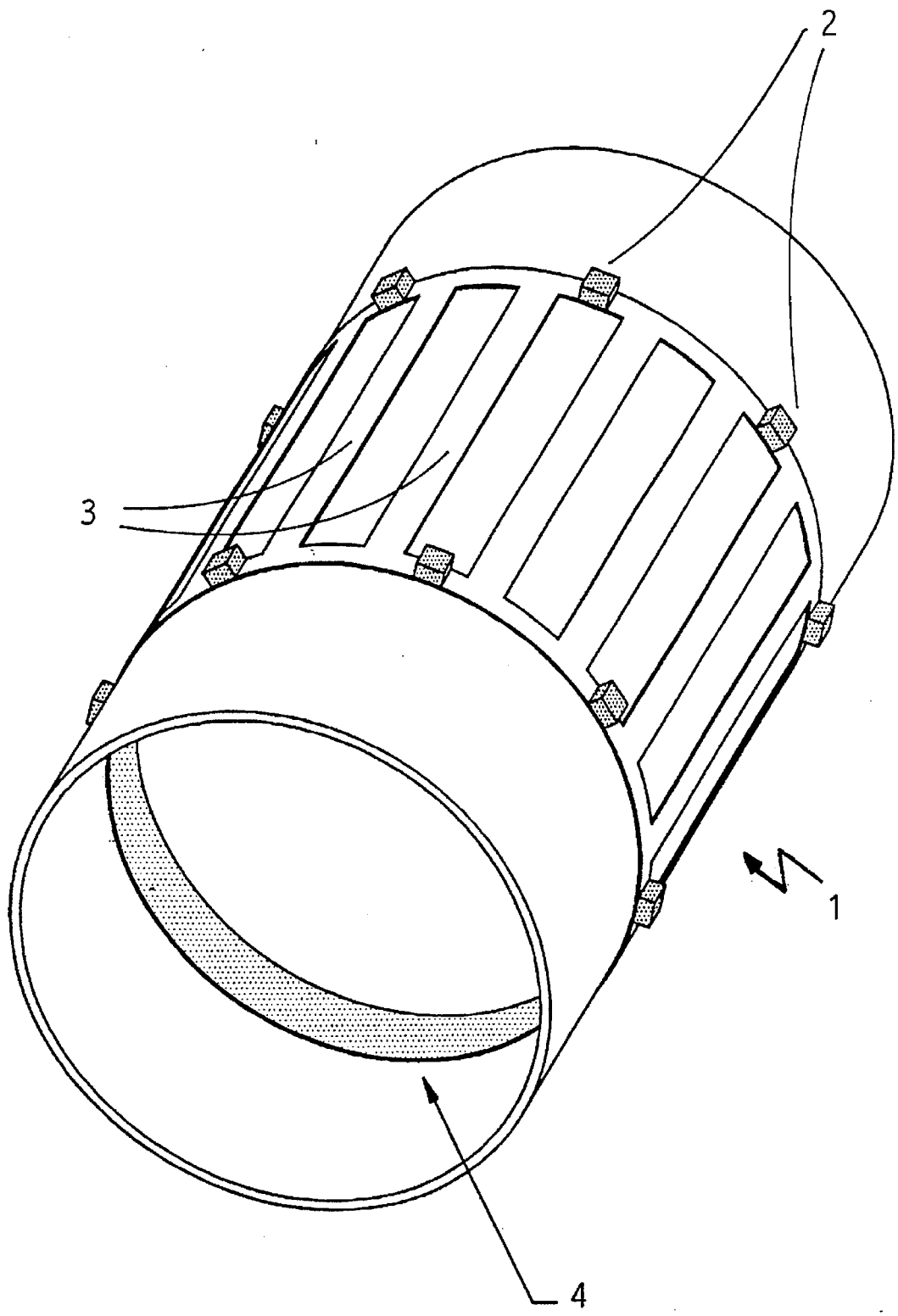
FIG. 6 is a perspective view of a resonator coil having a guard ring according to a further embodiment of the invention.

In a further embodiment, guard rings 4 (rings of copper or other RF opaque conductors) are placed internal to the capacitors as shown in FIG. 6 to limit the RF window of the coil and to lower the losses to the sample by electric field linking to the sample, the electric field being very high in the regions surrounding the capacitors. These rings also have the effect of preventing broad signals from being acquired from long samples extending outside the "well-shimmed" region of the magnet of the NMR apparatus.

The foregoing describes only some embodiments of the invention, and modifications which are obvious to those skilled in the art may be made thereto without departing from the scope hereof.

We claim:

1. An RF resonator having a generally tubular structure and for use in an NMR apparatus, the resonator comprising:
   axial conductors spaced to form the generally tubular structure, the axial conductors having first and second ends;
   a first ring conductor coupled to the first ends; a second ring conductor coupled to the second ends; first capacitive elements spaced along and interrupting said first ring conductor; and
   second capacitive elements spaced along and interrupting said second ring conductor, wherein a number of said first capacitive elements and a number of said second capacitive elements is each smaller than a number of said axial conductors and RF energy is coupled to and from the resonator between two neighboring axial conductors via two parallel capacitors, wherein all axial conductors carry non-zero integrated current.

2. The RF resonator of claim 1, wherein a plurality of axial conductors are located between a pair of adjacent first capacitive elements and RF energy is coupled to and from the resonator between two neighboring axial conductors via two parallel capacitors, wherein all axial conductors carry non-zero integrated current.

3. The resonator of claim 2, wherein two axial conductors are located between each pair of adjacent first and adjacent second capacitive elements.

4. The resonator of claim 2, further comprising conductive guard rings placed internally to said first and said second capacitive elements to limit an RF window of the resonator and to lower dielectric losses to a sample inside the tubular structure.

5. The resonator of claim 2, further comprising conductive guard rings placed internally to said first and said second capacitive elements to limit an RF window of the resonator and to lower dielectric losses to a sample inside the tubular structure.

6. The resonator of claim 5, wherein the resonator is adapted to operate at a frequency of 300 MHz.

7. The resonator of claim 6, wherein the tubular structure has an inner diameter of less than 100 mm.

8. The resonator of claim 7, wherein said axial conductors are conducting strips of finite widths and wherein said axial conductors have differing widths.

9. The resonator of claim 1, wherein the resonator comprises 16 axial conductors.

10. The resonator of claim 1, wherein there are less than 9 of said first capacitive elements and less than 9 of said second capacitive elements.

11. The resonator of claim 1, wherein the resonator is adapted to operate at a frequency greater than or equal to 200 MHz.

12. The resonator of claim 11, wherein the resonator is adapted to operate at a frequency of 300 MHz.

13. The resonator of claim 1, wherein said axial conductors are conducting strips of finite widths.

14. The resonator of claim 1, wherein the tubular structure has an inner diameter of less than 100 mm.

15. The resonator of claim 14, wherein said inner diameter is 64 mm.

16. The resonator of claim 1, wherein said axial conductors have differing widths.

17. The resonator of claim 1, wherein said axial conductors are distributed azimuthally to approximate a sinusoidal current distribution.

18. The resonator of claim 1, further comprising conductive guard rings placed internally to said first and said second capacitive elements to limit an RF window of the resonator and to lower dielectric losses to a sample inside the tubular structure.

* * * * *

UNITED STATES PATENT AND TRADEMARK OFFICE
CERTIFICATE OF CORRECTION

PATENT NO. : 5,642,048

DATED : June 24, 1997

INVENTOR(S) : Stuart Crozier and David Michael Doddrell

It is certified that error appears in the above-indentified patent and that said Letters Patent is hereby corrected as shown below:

In column 4, line 53, please replace "E" with --E--, and "B" with --B--. In line 54 of this column, please replace "j" with --j--. Between lines 55 and 62, please replace equation 1 as follows:

$$\mathbf{E}(x,y,z,t) = \mathbf{E}_T(x,y)\exp(i\omega[\sqrt{\mu\epsilon}z - t])$$
$$\mathbf{B}(x,y,z,t) = \mathbf{B}_T(x,y)\exp(i\omega[\sqrt{\mu\epsilon}z - t])$$
$$\mathbf{j}(x,y,z,t) = \mathbf{j}_T(x,y)\exp(i\omega[\sqrt{\mu\epsilon}z - t]), \qquad (1)$$

In line 66 of this column, please replace "$E_T$ and $B_T$" with --$\mathbf{E}_T$ and $\mathbf{B}_T$--.

In column 5, line 1, please replace "$E_T \cdot k=0$ and $B_T \cdot k=0$" with --$\mathbf{E}_T \cdot \mathbf{k}=0$ and $\mathbf{B}_T \cdot \mathbf{k}=0$--. In line 2 of this column, please replace "k" with --k--. In this column, between lines 7 and 10, please replace equation 2 as follows
--$\mathbf{B}_T = -\sqrt{\mu\epsilon}(\mathbf{k} \times \mathbf{E}_T)$.--. Please replace the equation in line 14 of this column as follows --$\nabla_2 \times \mathbf{E}_T = 0$--. In line 16, please replace "$E_T = -\nabla_2 \phi$" with --$\mathbf{E}_T = -\nabla_2 \phi$--. In line 17 of this column, please replace "$\nabla_2 = (\partial/\partial x, \partial/\partial y)$" with --$\nabla_2 = (\partial/\partial x, \partial/\partial y)$--. In line 26 of this column, please replace "$j_T$" with --$\mathbf{j}_T$--. Between lines 27 and 31, please replace equation (3) as follows --$\mathbf{j}_T = \sqrt{\mu/\epsilon}(\mathbf{n} \cdot \nabla_2 \phi)\mathbf{k}$, (3)--. In line 35 of this column, please replace "$\nabla_2 \cdot \mathbf{E}_T = 0$" with --$\nabla_2 \cdot \mathbf{E}_T = 0$--.

UNITED STATES PATENT AND TRADEMARK OFFICE
CERTIFICATE OF CORRECTION

PATENT NO. : 5,642,048
DATED : June 24, 1997
INVENTOR(S) : Stuart Crozier and David Michael Doddrell It is certified that error appears in the above-indentified patent and that said Letters Patent is hereby corrected as shown below:

In column 6, claim 4, line 1, please replace "claim 2" with --claim 1--.

Signed and Sealed this

Second Day of December, 1997

Attest:

BRUCE LEHMAN

Attesting Officer
Commissioner of Patents and Trademarks